(12) United States Patent  (10) Patent No.: US 8,570,104 B2
Heid                      (45) Date of Patent:     Oct. 29, 2013

(54) AMPLIFIER ASSEMBLY HAVING CONTROLLED RETURN OF POWER LOSS

(75) Inventor: Oliver Heid, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/510,060

(22) PCT Filed: Oct. 18, 2010

(86) PCT No.: PCT/EP2010/065594
§ 371 (c)(1),
(2), (4) Date: May 16, 2012

(87) PCT Pub. No.: WO2011/061025
PCT Pub. Date: May 26, 2011

(65) Prior Publication Data
US 2012/0229215 A1    Sep. 13, 2012

(30) Foreign Application Priority Data
Nov. 17, 2009 (DE) .......................... 10 2009 053 622

(51) Int. Cl.
    *H03G 3/00* (2006.01)
(52) U.S. Cl.
    USPC ......... 330/127; 330/124 R; 330/138; 330/297
(58) Field of Classification Search
    USPC ................ 330/127, 124 R, 138, 297
    See application file for complete search history.

(56) References Cited

U.S. PATENT DOCUMENTS

| | | | |
|---|---|---|---|
| 4,399,499 A | 8/1983 | Butcher et al. | 363/17 |
| 5,631,604 A * | 5/1997 | Dent et al. | 330/124 R |
| 5,767,744 A * | 6/1998 | Irwin et al. | 330/297 |
| 6,133,788 A | 10/2000 | Dent | 330/124 R |
| 6,285,251 B1 | 9/2001 | Dent et al. | 330/127 |
| 6,313,703 B1 * | 11/2001 | Wright et al. | 330/149 |

(Continued)

FOREIGN PATENT DOCUMENTS

| | | |
|---|---|---|
| CN | 1874133 A | 12/2006 |
| EP | 1243065 B1 | 1/2004 |
| JP | 2005287140 A | 10/2005 |

OTHER PUBLICATIONS

International PCT Search Report and Written Opinion, PCT/EP2010/065594, 11 pages, May 6, 2011.

*Primary Examiner* — Patricia Nguyen
(74) *Attorney, Agent, or Firm* — King & Spalding L.L.P.

(57) ABSTRACT

An amplifier assembly includes an input signal determiner that determines a first input signal and a second input signal based on an initial signal having an amplitude and an initial frequency. Amplifiers amplify the first and second input signal to form first and second output signals having a phase offset with respect to one another. The first and second amplified output signals are fed to a common coupling element that forms a useful signal and a loss signal, such that a total power of the useful signal and loss signal is independent of the phase offset, the power of the useful signal has a maximum corresponding to a predetermined value of the phase offset, and the partial power of the useful signal decreases with a deviation of the phase offset from the predetermined value. The coupling element feeds the useful signal to a load and the loss signal to a rectifier device that feeds a rectified loss signal to a power supply device, wherein the rectifier device includes active components as rectifier elements, which are controlled synchronously with respect to the initial frequency.

6 Claims, 3 Drawing Sheets

(56) References Cited

U.S. PATENT DOCUMENTS 6,469,919 B1 * 10/2002 Bennett ................ 363/56.02
7,508,262 B1    3/2009 Wagner et al. ............ 330/136
8,107,263 B2 *  1/2012 Ueno et al. ............. 363/21.02
2005/0286278 A1 * 12/2005 Perreault et al. ........... 363/65

* cited by examiner

AMPLIFIER ASSEMBLY HAVING CONTROLLED RETURN OF POWER LOSS

CROSS-REFERENCE TO RELATED APPLICATIONS

This application is a U.S. National Stage Application of International Application No. PCT/EP2010/065594 filed Oct. 18, 2010, which designates the United States of America, and claims priority to DE Patent Application No. 10 2009 053 622.1 filed Nov. 17, 2009. The contents of which are hereby incorporated by reference in their entirety.

TECHNICAL FIELD

The present disclosure relates to an amplifier assembly for an initial signal having an initial frequency,
wherein the amplifier assembly has an input signal determiner, to which the initial signal is fed and which determines a first input signal and a second input signal on the basis of the initial signal,
wherein the input signal determiner feeds the first input signal to a first amplifier, which amplifies the first input signal to form a first output signal,
wherein the input signal determiner feeds the second input signal to a second amplifier, which amplifies the second input signal to form a second output signal,
wherein the output signals have mutually identical amplitudes and the initial frequency, and their phase offset with respect to one another, relative to the initial frequency, is dependent on the absolute value of the amplitude of the initial signal,
wherein the amplifiers feed their output signals to a common coupling element, which forms a useful signal and a loss signal on the basis of the output signals,
wherein the coupling element is embodied in such a way that
 a total power which the useful signal and the loss signal have together is independent of the phase offset of the output signals,
 a partial power exhibited by the useful signal is at a maximum if the phase offset of the output signals has a predetermined value, and
 the partial power exhibited by the useful signal decreases with the deviation of the phase offset of the output signals from the predetermined value,
wherein the coupling element feeds the useful signal to a load and feeds the loss signal to a rectifier device,
wherein the rectifier device rectifies the loss signal and feeds the rectified loss signal to a power supply device of the amplifier assembly.

The present disclosure also relates to an operating method for an amplifier assembly of this type.

BACKGROUND

An amplifier assembly and operating method for an amplifier assembly are known, for example, from U.S. Pat. No. 6,133,788 A and from U.S. Pat. No. 6,285,251 B.

It is known that an individual amplifier attains its maximum efficiency only when it is operated at its maximum saturated output level (or at least close to the latter). In order to be able to maintain the maximum efficiency over a relatively large power range, therefore, amplifier assemblies having two amplifiers are used. The two amplifiers are operated in such a way that they both operate at their maximum saturated output level. The output signals are combined to form a useful signal by means of a suitable coupling element. The amplitude of the useful signal is set by the phase offset of the two output signals being correspondingly set. In general, a hybrid or a ring coupler is used as the coupling element.

If the phase offset of the output signals differs from zero, a loss signal also arises in addition to the useful signal. The loss signal leads to negative reactions affecting the amplifiers. In order to avoid such reactions, it is possible to provide a resistor, for example, which converts the loss signal into heat. The use of the resistor improves the operating conditions (reduced reactions affecting the amplifiers, reduced distortions, etc.) of the amplifier assembly. However, the resistor leads at the same time—particularly in the case of a large phase offset, i.e. a small partial power of the useful signal—to a reduced total efficiency of the amplifier assembly.

The amplifier assemblies mentioned are used, inter alia, in mobile radio devices. They are also used in other battery-powered devices. The energy efficiency is of particular importance in battery-powered devices. Therefore, attempts have already been made to use, instead of the resistor, a rectifier device which rectifies the loss signal and feeds the rectified loss signal to a power supply device of the amplifier assembly.

In conventional systems, the rectifier device is constructed using uncontrolled rectifier elements (=diodes). When such rectifier elements are used, the limiter effect of the rectifier elements cannot be influenced. As a result, the effective resistance of the rectifier device is modulation-dependent, i.e., dependent on the phase offset of the output signals from one another. On account of the variability of the effective resistance of the rectifier device, the rectifier device is not well matched for all phase offsets. For some phase offsets, reflections into the amplifiers occur, which, for their part, result in nonlinear distortions and reductions of efficiency.

SUMMARY

In one embodiment, an amplifier assembly for an initial signal having an initial frequency is provided, wherein the amplifier assembly has an input signal determiner, to which the initial signal is fed and which determines a first input signal and a second input signal on the basis of the initial signal, wherein the input signal determiner feeds the first input signal to a first amplifier, which amplifies the first input signal to form a first output signal, wherein the input signal determiner feeds the second input signal to a second amplifier, which amplifies the second input signal to form a second output signal, wherein the output signals have mutually identical amplitudes and the initial frequency, and their phase offset with respect to one another, relative to the initial frequency, is dependent on the absolute value of the amplitude of the initial signal, wherein the amplifiers feed their output signals to a common coupling element, which forms a useful signal and a loss signal on the basis of the output signals, wherein the coupling element is embodied in such a way that a total power which the useful signal and the loss signal have together is independent of the phase offset of the output signals, a partial power exhibited by the useful signal is at a maximum if the phase offset of the output signals has a predetermined value, and the partial power exhibited by the useful signal decreases with the deviation of the phase offset of the output signals from the predetermined value, wherein the coupling element feeds the useful signal to a load and feeds the loss signal to a rectifier device, wherein the rectifier device rectifies the loss signal and feeds the rectified loss signal to a power supply device of the amplifier assembly, and wherein the rectifier device has active components as rectifier elements, and in that the active components are controlled synchronously with respect to the initial frequency.

In a further embodiment, the active components are embodied as field effect transistors. In a further embodiment, the field effect transistors are embodied as MOSFETs. In a further embodiment, the phase offset of the output signals is fed to a control device for the rectifier device, and in that the control device takes account of the phase offset when determining control signals for the active components.

In another embodiment, an operating method for an amplifier assembly is provided, wherein an initial signal having an initial frequency is fed to an input signal determiner of the amplifier assembly, wherein the input signal determiner determines a first input signal and a second input signal on the basis of the initial signal, wherein the input signal determiner feeds the first input signal to a first amplifier, which amplifies the first input signal to form a first output signal, wherein the input signal determiner feeds the second input signal to a second amplifier, which amplifies the second input signal to form a second output signal, wherein the output signals have mutually identical amplitudes and the initial frequency, and their phase offset with respect to one another, relative to the initial frequency, is dependent on the absolute value of the amplitude of the initial signal, wherein the amplifiers feed their output signals to a common coupling element, which forms a useful signal and a loss signal on the basis of the output signals, wherein a total power which the useful signal and the loss signal have together is independent of the phase offset of the output signals, a partial power exhibited by the useful signal is at a maximum if the phase offset of the output signals has a predetermined value, and the partial power exhibited by the useful signal decreases with the deviation of the phase offset of the output signals from the predetermined value, wherein the coupling element feeds the useful signal to a load and feeds the loss signal to a rectifier device, wherein the rectifier device rectifies the loss signal and feeds the rectified loss signal to a power supply device of the amplifier assembly, and wherein active components of the rectifier device which act as rectifier elements are controlled synchronously with respect to the initial frequency and thereby rectify the loss signal.

In a further embodiment of the method, the phase offset of the output signals is fed to a control device for the rectifier device, and in that the control device takes account of the phase offset when determining control signals for the active components.

BRIEF DESCRIPTION OF THE DRAWINGS

Example embodiments will be explained in more detail below with reference to figures, in which.

DETAILED DESCRIPTION

Some embodiments provide an amplifier assembly having a rectifier device that has active components as rectifier elements, and that the active components are controlled synchronously with respect to the initial frequency.

The method according to certain embodiments provides for correspondingly operating the amplifier assembly, that is to say for controlling the active components acting as rectifier elements synchronously with respect to the initial frequency and for thereby rectifying the loss signal.

By using the active components driven synchronously with respect to the initial frequency (for short: a synchronous rectifier), the off and on times of the active components can be controlled. As a result, it is possible to optimize the effective load impedance for the power loss. In interaction with the coupling element and the setting of the phase offset, what can thereby be achieved is that the useful signal with the desired partial power is fed to the load, both amplifiers operate with an optimum (in particular modulation-independent) load impedance, modulation nonlinearities, distortions and reactions are kept small, and a high total efficiency is nevertheless achieved.

The active components can be embodied as required. Preferably, field effect transistors are involved, in particular MOSFETs.

In order to optimize the driving of the active components, it may be provided, in particular, that the phase offset of the output signals is fed to a control device for the rectifier device, and that the control device takes account of the phase offset when determining control signals for the active components.

Figure 1:
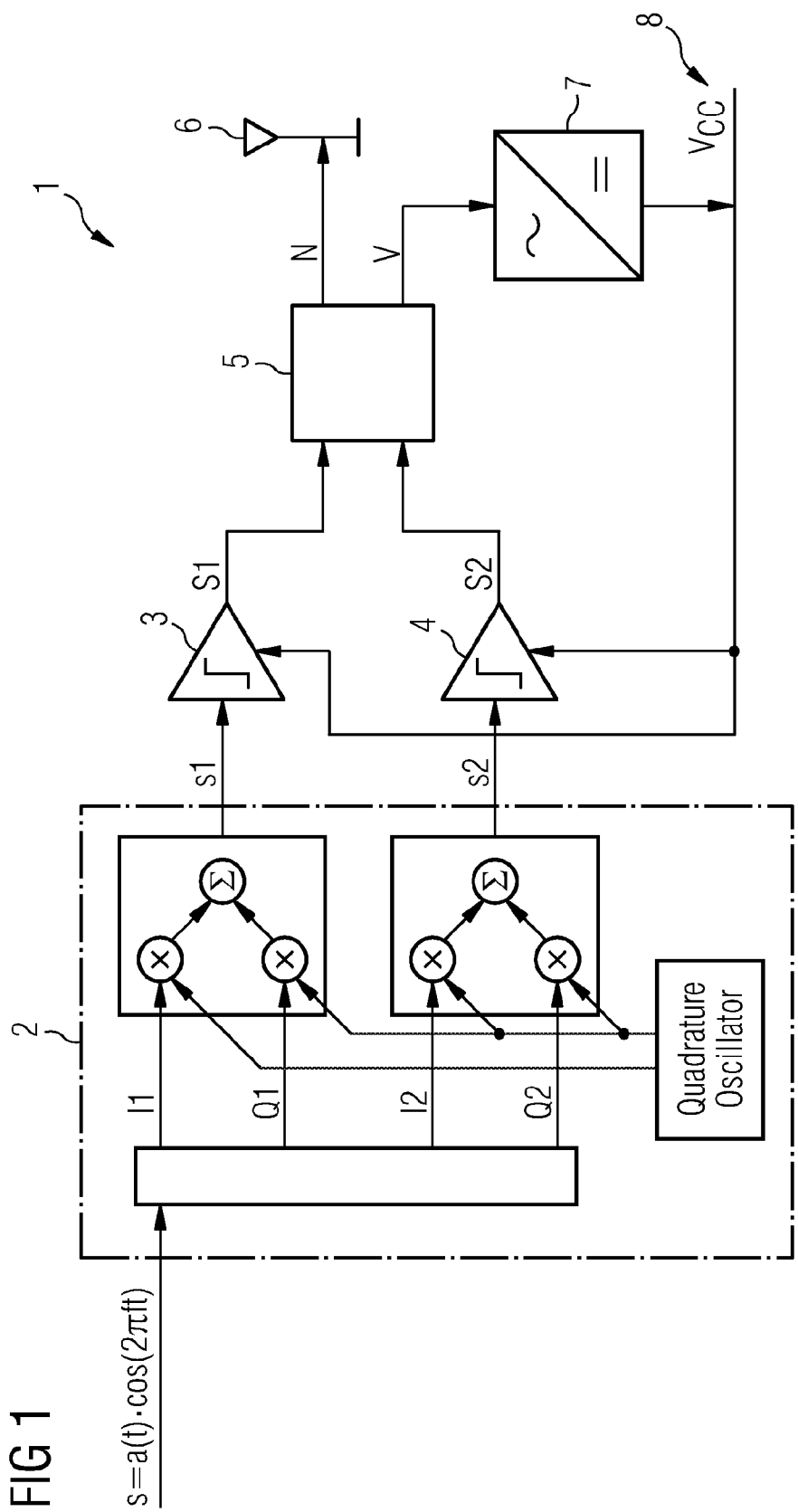
FIG. 1 shows a block diagram of an example amplifier assembly, according to one embodiment.

In accordance with FIG. 1, an amplifier assembly 1 has an input signal determiner 2. An initial signal s is fed to the input signal determiner 2. The initial signal s is an alternating signal having an initial frequency f and an amplitude a. The term "initial frequency" was chosen in this case in order to indicate the relationship with the initial signal s. A more extensive significance is not accorded to the term "initial frequency". The initial signal s is often a signal in a frequency range above 20 MHz. In some cases, the initial signal s even has an initial frequency f of more than one GHz. In some instances, even 10 GHz is exceeded.

The input signal determiner 2 determines a first input signal s1 on the basis of the initial signal s. The first input signal s1 has the initial frequency f. If a first amplifier 3, which amplifies the first input signal s1 to form a first output signal S1, has nonlinearities, the first input signal s1 can be correspondingly predistorted by the input signal determiner 2, such that the nonlinearities of the first amplifier 3 are precompensated for.

The input signal determiner 2 feeds the input signal s1 to the first amplifier 3. The first amplifier 3 amplifies the first input signal s1 to form the first output signal S1.

The input signal determiner 2 furthermore determines a second input signal s2 on the basis of the initial signal s. The second input signal s2 likewise has the initial frequency f. If a second amplifier 4, which amplifies the second input signal s2 to form a second output signal S2, has nonlinearities, the second input signal s2 can correspondingly be predistorted by the input signal determiner 2, such that the nonlinearities of the second amplifier 4 are precompensated for.

The input signal determiner 2 feeds the second input signal s2 to the second amplifier 4. The second amplifier 4 amplifies the second input signal s2 to form the second output signal S2.

The input signal determiner 2 can be embodied in a known manner. By way of example, the input signal determiner 2 can be embodied as a digital signal processor that determines quadrature signals on the basis of the initial signal s, the first input signal s1 and the second input signal s2 being determined, in turn, on the basis of said quadrature signals. The construction and manner of operation of a digital signal processor and the determination of quadrature signals are generally known to those skilled in the art.

Figure 2:
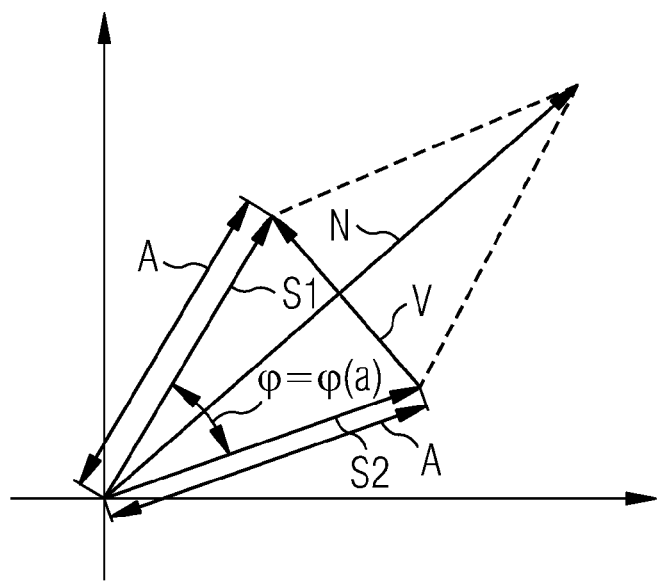
FIG. 2 shows a phasor diagram.

The first output signal S1 and the second output signal S2 have the same amplitude A as each other in accordance with FIG. 2. The amplitude A is independent of the amplitude a of the initial signal s. It lies in the range of the maximum amplitude of the amplifiers 3, 4. However, the first output signal S1 and the second output signal S2 have a phase offset φ with respect to one another—relative to the initial frequency f. The phase offset φ is dependent on the amplitude a of the initial signal s.

In general, the amplifiers 3, 4 are embodied identically and are operated in the same manner (in particular with the same gain). In general, the above statements (identical amplitude that is not dependent on the amplitude a of the initial signal s, and phase offset that is dependent on the amplitude a of the initial signal s) therefore analogously also apply to the input signals s1, s2 fed to the amplifiers 3, 4.

In accordance with FIG. 1, the amplifiers 3, 4 feed their output signals S1, S2 to a common coupling element 5. The coupling element 5 forms a useful signal N and a loss signal V on the basis of the output signals S1, S2. The coupling element 5 can be embodied, for example, as a ring coupler, as a directional coupler, as a 90° hybrid or as a 180° hybrid. In these cases, the coupling element 5 forms a summation signal and a difference signal from the two output signals S1, S2. In this case, the summation signal corresponds to the useful signal N, and the difference signal corresponds to the loss signal V.

The coupling element 5 is a coupling element 5 that operates in a lossless manner. It is embodied in such a way that it converts the output signals S1, S2 fed to it into the useful signal N and the loss signal V in a lossless manner. In particular, therefore, a total power which the useful signal N and the loss signal V have together is independent of the phase offset φ of the output signals S1, S2. By contrast, in accordance with FIG. 2, an amplitude (and associated therewith also a partial power) exhibited by the useful signal N is dependent on the phase offset φ. If the phase offset φ is equal to a predetermined value, the partial power of the useful signal N is at a maximum, and that of the loss signal V is at a minimum. In the optimum case, the partial power of the useful signal N is in this case equal to the sum of the individual powers of the two output signals S1, S2, and the partial power of the loss signal V is equal to zero. The further the phase offset φ deviates from the predetermined value, the lower the partial power of the useful signal N. The partial power of the useful signal N therefore decreases with the deviation of the phase offset φ from the predetermined value, in general even strictly monotonically.

The predetermined value at which the partial power of the useful signal N is at a maximum is dependent on the type of coupling element 5. It can be 90° or 180°, for example. In the illustration in FIG. 2 it was assumed that the predetermined value is 0°.

The coupling element 5 feeds the useful signal N to a load 6. The coupling element 5 furthermore feeds the loss signal V to a rectifier device 7. The load 6 can be, for example, in accordance with the illustration in FIG. 1, a transmitting antenna, in particular. However, other loads are also conceivable. In the case of a transmitting antenna, the amplifier assembly 1 is part of a so-called "outphasing transmitter". The rectifier device 7 rectifies the loss signal V. The rectifier device 7 feeds the rectified loss signal to a power supply device 8 of the amplifier assembly 1.

Figure 3:
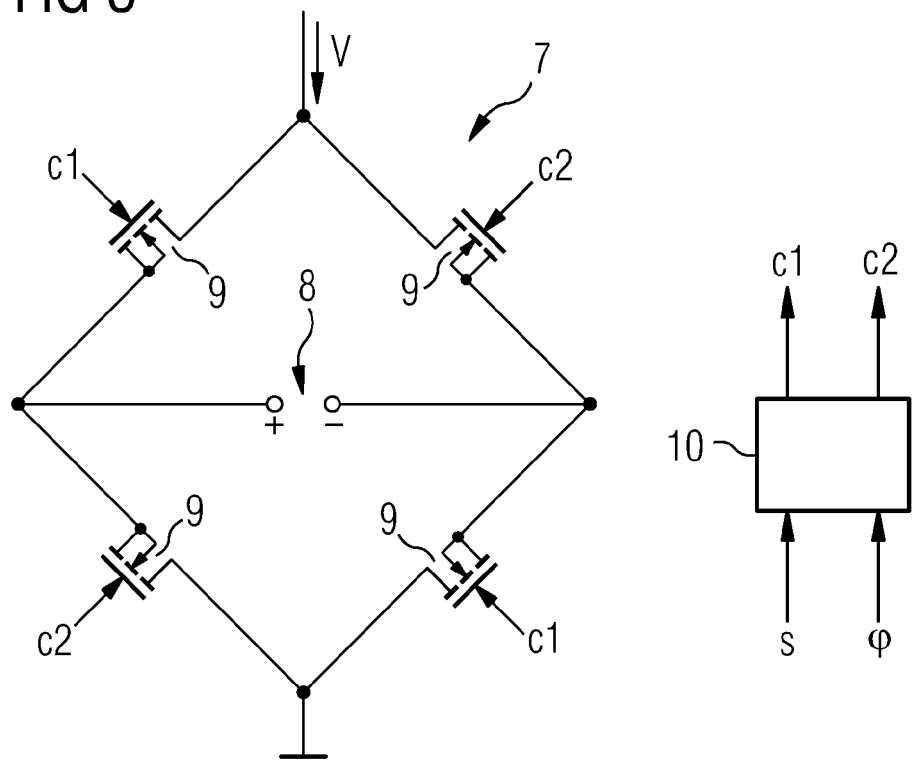
FIG. 3 shows an example rectifier device, according to one embodiment.

In accordance with FIG. 3, the rectifier device 7 is embodied as a bridge rectifier. This configuration constitutes the general case of the rectifier device 7. However, other configurations are also conceivable, in particular a configuration as a simple half-wave rectifier. In accordance with FIG. 3, the rectifier device 7 has active components as rectifier elements 9. The active components 9 can be embodied as required. Preferably, the active components 9 are embodied as field effect transistors, in particular as MOSFETs. A configuration as IGBT is also possible, however.

Generally it suffices if, for each current path of the rectifier device 7, at least one of the rectifier elements 9 situated in the respective current path is embodied as an active component 9. In the case of the configuration of the rectifier device 7 in accordance with FIG. 3, therefore, for example two of the four rectifier elements 9 could be embodied as simple, uncontrolled rectifier elements (=diodes). In accordance with FIG. 3, however, all the rectifier elements 9 are embodied as active components.

Figure 4:
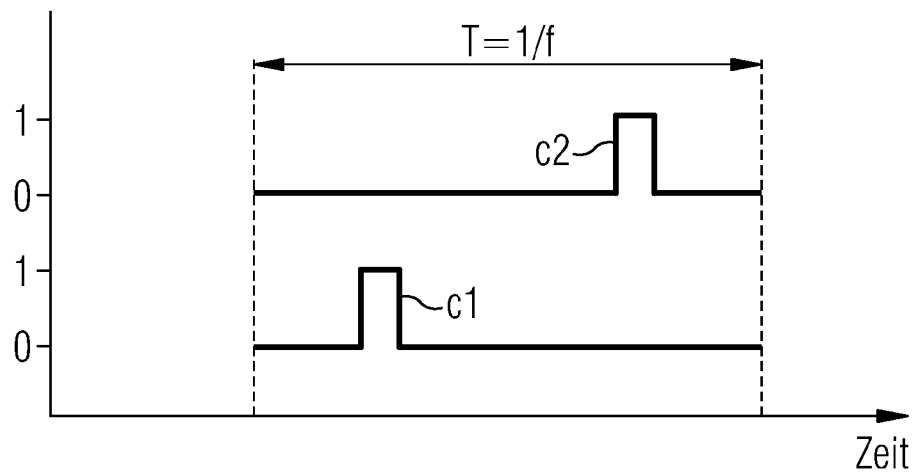
FIGS. 4 and 5 show example timing diagrams.
Figure 5:
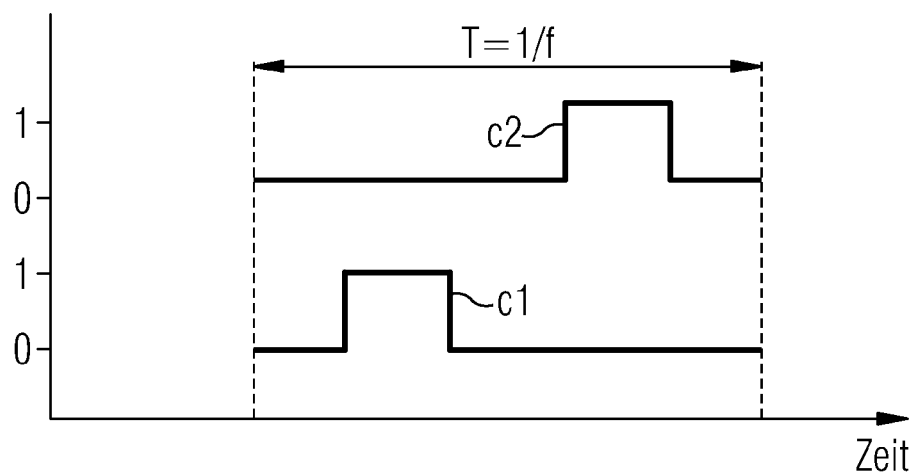

The active components 9 are controlled synchronously with respect to the initial frequency f in accordance with FIGS. 4 and 5. As a result, they rectify the loss signal V.

For correctly driving the active components 9, a control device 10 for the rectifier device 7 is—of course—fed a signal that oscillates with the initial frequency f, for example the initial signal s or a corresponding clock signal. On the basis of this signal, the control device 10 determines which bridge branches of the rectifier device 7 are in each case permitted to be controlled in a conducting state and which bridge branches have to remain blocked. Preferably, the control device 10 is furthermore fed the phase offset φ of the output signals S1, S2. In this case, the control device 10 can take account of the phase offset φ when determining control signals c1, c2 for the active components 9. This is indicated in FIGS. 4 and 5 by the fact that different off and on times of the active components 9 are depicted for the phase offset φ in the illustration in FIG. 5 than for the phase offset φ in the illustration in FIG. 4.

Certain embodiments provide various advantages. For example, a high energy efficiency can be achieved in a simple manner, and nevertheless virtually no feedbacks to the amplifiers 3, 4 occur. In particular, a good linearity of the amplifiers 3, 4 arises as a result.

The amplifier assembly 1 according to certain embodiments can be used for various purposes of use. For example, the amplifier assembly 1 may be used in mobile, battery-powered devices, for example in mobile radio devices, including cellular phones. A use in high-power transmitters is also possible. Examples of such high-power transmitters are, for example, the transmitting amplifiers for the transmitting antennas and the gradient coils of magnetic resonance apparatuses.

The above description serves exclusively for elucidating the present invention. By contrast, the scope of protection of the present invention is intended to be determined exclusively by the accompanying claims.

List Of Reference Symbols
1 Amplifier assembly
2 Input signal determiner
3, 4 Amplifiers
5 Coupling element
6 Load
7 Rectifier device
8 Power supply device
9 Rectifier elements/active components
10 Control device
a, A Amplitudes
c1, c2 Control signals
f Initial frequency
N Useful signal
s Initial signal
s1, s2 Input signals S1, S2 Output signals
V Loss signal
φ Phase offset

What is claimed is:

1. An amplifier assembly for an initial signal having an amplitude and an initial frequency, comprising:
an input signal determiner configured to:
receive the initial signal and determine a first input signal and a second input signal based on the initial signal,
feed the first input signal to a first amplifier that amplifies the first input signal to form a first output signal,
feed the second input signal to a second amplifier that amplifies the second input signal to form a second output signal,
wherein the first and second output signals have the same amplitude, and have a phase offset with respect to one another, relative to the initial frequency, which is dependent on the absolute value of the amplitude of the initial signal,
wherein the first and second amplifiers are configured to feed their respective first and second output signals to a common coupling element,
wherein the common coupling element is configured to form a useful signal and a loss signal based on the first and second output signals, such that:
a total power including a partial power of the useful signal and a partial power of the loss signal is independent of the phase offset of the first and second output signals,
the partial power of the useful signal has a maximum corresponding to a predetermined value of the phase offset of the output signals, and
the partial power of the useful signal decreases with a deviation of the phase offset of the first and second output signals from the predetermined value,
wherein the coupling element is further configured to feed the useful signal to a load and feed the loss signal to a rectifier device,
wherein the rectifier device is configured to rectify the loss signal and feed the rectified loss signal to a power supply device of the amplifier assembly, and
wherein the rectifier device includes active components as rectifier elements, wherein the active components are controlled synchronously with respect to the initial frequency.

2. The amplifier assembly of claim 1, wherein the active components are embodied as field effect transistors.

3. The amplifier assembly of claim 2, wherein the field effect transistors are embodied as MOSFETs.

4. The amplifier assembly of claim 1, wherein the phase offset of the first and second output signals is fed to a control device for the rectifier device, and in that the control device takes account of the phase offset when determining control signals for the active components.

5. An operating method for an amplifier assembly, comprising:
an input signal determiner receiving an initial signal having an amplitude and an initial frequency, and determining a first input signal and a second input signal based on the initial signal,
the input signal determiner feeding the first input signal to a first amplifier that amplifies the first input signal to form a first output signal,
the input signal determiner feeding the second input signal to a second amplifier that amplifies the second input signal to form a second output signal,
wherein the first and second output signals have the same amplitude, and have a phase offset with respect to one another, relative to the initial frequency, which is dependent on the absolute value of the amplitude of the initial signal,
the first and second amplifiers feeding their respective first and second output signals to a common coupling element,
the common coupling element forming a useful signal and a loss signal based on the first and second output signals, such that:
a total power including a partial power of the useful signal and a partial power of the loss signal is independent of the phase offset of the first and second output signals,
the partial power of the useful signal has a maximum corresponding to a predetermined value of the phase offset of the output signals, and
the partial power of the useful signal decreases with a deviation of the phase offset of the first and second output signals from the predetermined value,
the coupling element feeding the useful signal to a load and feed the loss signal to a rectifier device, and
the rectifier device rectifying the loss signal and feed the rectified loss signal to a power supply device of the amplifier assembly, wherein the rectifier device includes active components as rectifier elements, wherein the active components are controlled synchronously with respect to the initial frequency.

6. The operating method for an amplifier assembly as claimed in claim 5, wherein the phase offset of the first and second output signals is fed to a control device for the rectifier device, and in that the control device takes account of the phase offset when determining first and second control signals for the active components.

* * * * *